(12) United States Patent
Rife

(10) Patent No.: US 6,252,774 B1
(45) Date of Patent: Jun. 26, 2001

(54) MULTI-DEVICE HEAT SINK ASSEMBLY

(75) Inventor: William B. Rife, Cranston, RI (US)

(73) Assignee: Chip Coolers, Inc., Warwick, RI (US)

( * ) Notice: Subject to any disclaimer, the term of this patent is extended or adjusted under 35 U.S.C. 154(b) by 0 days.

(21) Appl. No.: 09/535,775

(22) Filed: Mar. 28, 2000

(51) Int. Cl.[7] .................................................. H05K 7/20
(52) U.S. Cl. ........................ 361/704; 257/727; 361/719
(58) Field of Search ............................. 165/80.3, 185; 174/16.3; 257/718, 719, 726, 727, 706, 707; 361/690, 703, 704, 705, 717–719, 722

(56) References Cited

U.S. PATENT DOCUMENTS

| | | | |
|---|---|---|---|
| Re. 35,573 | 7/1997 | Clemens | 257/719 |
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,621,304 * | 11/1986 | Oogaki . | |
| 4,660,123 | 4/1987 | Hermann | 361/386 |
| 4,745,456 | 5/1988 | Clemens | 357/79 |
| 4,933,808 * | 6/1990 | Horton . | |
| 5,313,099 | 5/1994 | Tata et al. | 257/717 |
| 5,397,919 | 3/1995 | Tata et al. | 257/717 |
| 5,566,052 | 10/1996 | Hughes | 361/704 |
| 5,579,827 | 12/1996 | Chung | 165/80.3 |
| 5,667,870 | 9/1997 | McCullough | 428/131 |
| 5,708,564 | 1/1998 | Lin | 361/704 |
| 5,774,335 | 6/1998 | Pare et al. | 361/704 |
| 5,825,622 | 10/1998 | Rife et al. | 361/704 |
| 5,917,703 | 6/1999 | Murphy | 361/704 |
| 6,014,315 * | 1/2000 | McCullough . | |
| 6,021,045 * | 2/2000 | Johnson . | |
| 6,075,699 * | 6/2000 | Rife . | |

FOREIGN PATENT DOCUMENTS

| | | | |
|---|---|---|---|
| 295 16 627 U | 12/1995 | (DE) | H01L/23/40 |
| 0130279A3 | 1/1985 | (EP) . | |
| 58-176959 | 10/1983 | (JP) | H01L/23/36 |

* cited by examiner

Primary Examiner—Gerald Tolin
(74) Attorney, Agent, or Firm—Barlow, Josephs & Holmes, Ltd.

(57) ABSTRACT

A heat sink assembly for removing heat from multiple semiconductor device packages is disclosed. The heat sink assembly includes a circuit board where a first semiconductor device package is installed on the circuit board. A second semiconductor device package is installed on the circuit board. A support plate is positioned over the upper surface of said first semiconductor device and over the upper surface of the second semiconductor device. The support plate includes two threaded bores corresponding to the positioning and layout of the first and second semiconductor devices. The support plate is, preferably, secured relative to the first semiconductor device and said second semiconductor device by a clip on one side of the support plate and a pair of threaded fasteners on the opposing end. A first heat dissipating member is threadably received in the first threaded bore so that the flat bottom surface of the first heat dissipating member is in flush thermal communication with the upper surface of the first semiconductor package. A second heat dissipating member is threadably received in the second threaded bore so that the flat bottom surface of the second heat dissipating member is in flush thermal communication with the upper surface of the second semiconductor package. As a result, heat can be dissipated from the first semiconductor device and the second semiconductor simultaneously using a single, small footprint, heat sink assembly.

6 Claims, 3 Drawing Sheets

MULTI-DEVICE HEAT SINK ASSEMBLY

This application claims priority under 35 U.S.C. 119(e) from prior provisional patent application Serial No. 60/181, 394, filed Feb. 9, 2000.

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages.

As stated above, if heat is not properly dissipated from the semiconductor device, it will eventually fail. Many heat dissipation solutions are available in the prior art that are suitable for cooling a single semiconductor device. For example, various spring-biased clamps, carrying a heat sink, are available for heat dissipation. Further, a heat sink assembly is simply affixed directly to the circuit board carrying the semiconductor device to be cooled. However, these prior art cooling solutions are inadequate to accommodate an array of semiconductor devices because they are typically cumbersome and require large amounts of circuit board real estate around the semiconductor device. This is particularly disadvantageous in applications where space is at a premium, such as in a laptop computer.

Further attempts have been made to cool multiple devices in a single assembly. These devices typically provide for a single heat sink block that is dimensioned large enough to cover the entire array of devices to be cooled. However, these devices also cover the voids between the devices to be cooled resulting in inefficiency of the heat dissipating member. Further, the heat dissipating member cannot be customized to provided different levels of heat dissipation to different devices within the array.

In view of the foregoing, there is a demand for a heat sink assembly that may accommodate multiple semiconductor devices in a single assembly. There is a demand for a heat sink assembly that is compact and less expensive that other devices while providing superior heat dissipation.

SUMMARY OF THE INVENTION

The present invention preserves the advantages of prior art heat sink assemblies for integrated circuit and semiconductor devices, such as microprocessors. In addition, it provides new advantages not found in currently available assemblies and overcomes many disadvantages of such currently available assemblies.

The invention is generally directed to the novel and unique heat sink assembly with particular application in cooling multiple microprocessor integrated circuit devices, such as a pin grid array (PGA), ball grid array (BGA) and land grid array (LGA) semiconductor device packages. The heat sink assembly of the present invention enables the simple, easy and inexpensive assembly, use and maintenance of a heat sink assembly while realizing superior heat dissipation.

The present invention is specifically directed to a heat sink assembly for removing heat from multiple semiconductor device packages, such as a mobile processor card with multiple semiconductor devices installed thereon. The heat sink assembly includes a circuit board where a first semiconductor device package is installed on the circuit board. A second semiconductor device package is installed on the circuit board. A support plate is positioned over the upper surface of said first semiconductor device and over the upper surface of the second semiconductor device. The support plate includes two threaded bore corresponding to the positioning and layout of the first and second semiconductor devices. The support plate is, preferably, secured relative to the first semiconductor device and said second semiconductor device by a clip on side of the support plate and a pair of threaded fasteners on the opposing end. A first heat dissipating member is threadably received in the first threaded bore so that the flat bottom surface of the first heat dissipating member is in flush thermal communication with the upper surface of the first semiconductor package. A second heat dissipating member is threadably received in the second threaded bore so that the flat bottom surface of the second heat dissipating member is in flush thermal communication with the upper surface of the second semiconductor package. As a result, heat can be dissipated from the first semiconductor device and the second semiconductor simultaneously using a single, small footprint, heat sink assembly.

It is therefore an object of the present to provide a heat sink assembly that can accommodate a wide array of semiconductor device packages.

Another object of the present invention is to provide a heat sink assembly that can accommodate multiple devices for cooling.

It is a further object of the present invention to provide a heat sink assembly that can easily connect to an array of semiconductor devices.

It is a further object of the present invention to provide a heat sink assembly that can dissipate heat from multiple devices while having a small footprint and not requiring large amounts of circuit board real estate.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
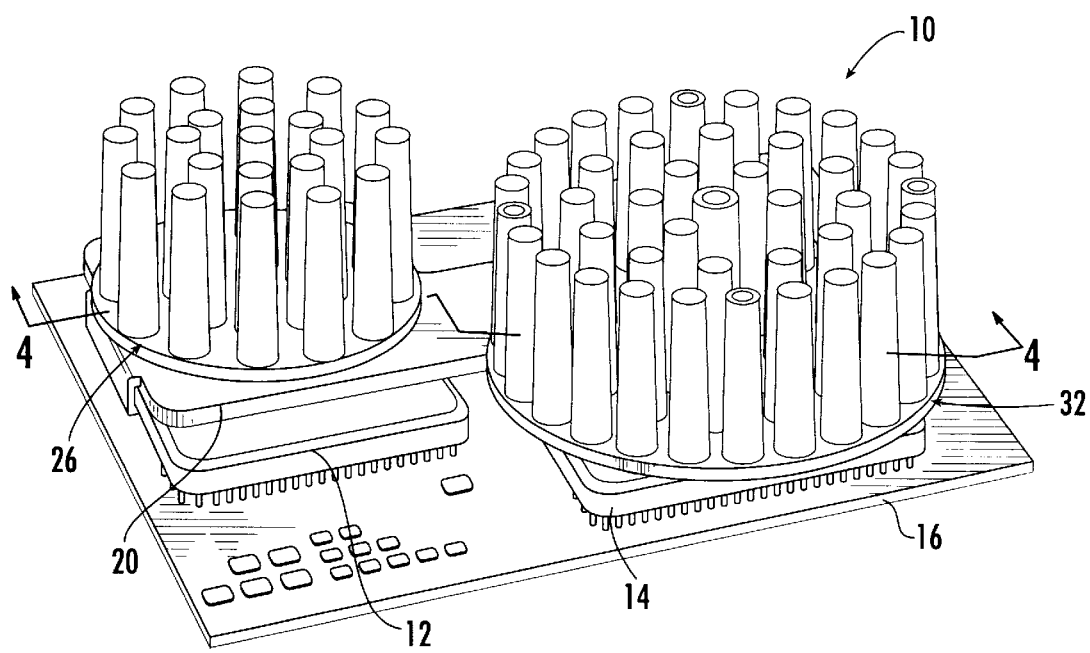
FIG. 1 is a perspective view of the heat sink assembly of the present invention installed on two semiconductor devices.

Referring first to FIG. 1, the heat sink assembly 10 of the present invention is shown fully assembled and installed on two semiconductor devices 12, 14 on a circuit board 16. The present invention may be employed for dissipating heat from a wide array of devices, including semiconductor devices. For simplicity, ease of illustration and by way of example, the present invention is shown in connection with the dissipation of heat from two PGA semiconductor devices 12, 14. It should be understood that the present invention may be easily modified within the scope of the present invention to accommodate BGA, LGA and other devices and still be within the scope of the present invention. Further, more that two device may be accommodated and still be within the scope of the present invention.

Figure 2:
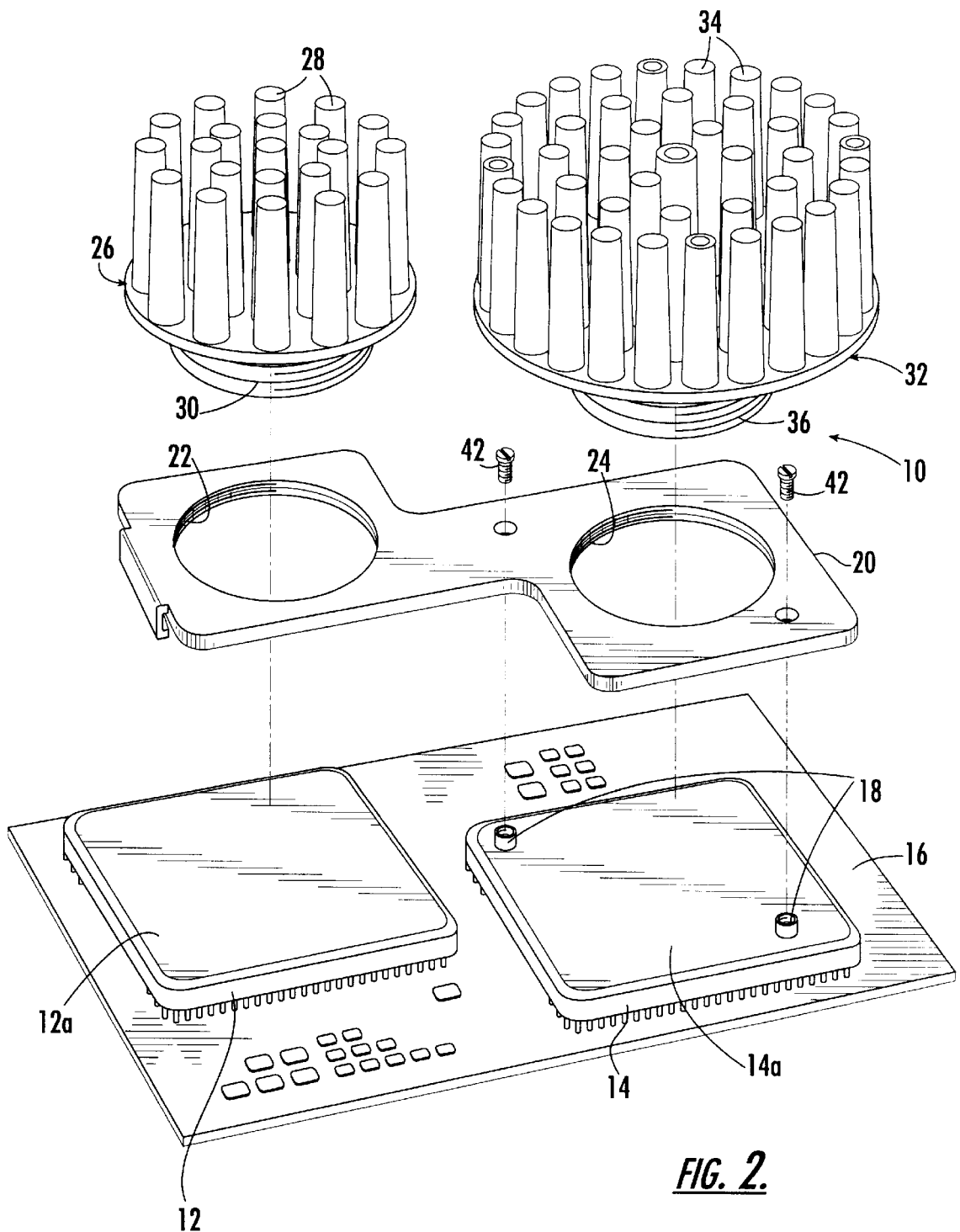
FIG. 2 is an exploded perspective view of the heat sink assembly of FIG. 1.

Referring now to FIGS. 1 and 2, a circuit board 16 is shown with a first semiconductor device 12 and a second semiconductor device 14 installed thereon. The first semiconductor device 12 is, by way of example, shown with a flat upper surface 12a which is preferably of a metallic material to assist in the dissipating of heat from the first semiconductor device. The second semiconductor device 14 also includes an upper surface 14a that is preferably of a metallic material to assist in the dissipation of heat from the second semiconductor device 14. The second semiconductor device 14 also, preferably, includes a pair of female threaded fastener receiving posts 18. This circuit board 16 and device 12, 14 arrangement may be a mobile processor card for a laptop computer, such as a mobile Pentium III processor card manufactured by the Intel Corporation. This is a processor card which is an example of an application of the heat sink assembly 10 of the present invention.

The heat sink assembly 10 of the present invention includes a support plate 20 with two female threaded bores 22, 24 therethrough. The support plate 20 is sized, dimensioned and configured to correspond to the layout of the first semiconductor device 12 and second semiconductor device 14 on the circuit board 16. The support plate 20 is preferably made of a rigid material, such as a fiber reinforced plastic material. The first threaded bore 22 is provided through the support plate 20 and is positioned to align over the first semiconductor device 12 while the second threaded bore 24 is provided through the support plate 20 and is positioned to align over the second semiconductor device 14. A first heat dissipating member 26 is provided with an array of upstanding fins 28 and threaded base 30. Similarly, a second heat dissipating member 32 is provided with an array of upstanding fins 34 and a threaded base 36. The threaded base 30 of the first heat dissipating member 26 is sized to correspond to and threadably engage with the first threaded aperture 22. The threaded base 36 of the second heat dissipating member 32 is sized to correspond to and threadably engage with the second threaded aperture 24.

The fin arrangement shown in the figures are shown as a pin array but may be other configurations, such as radial fins. It should be understood that the heat dissipating member configuration may be modified to suit the application at hand. The threaded components of the present invention, namely the threaded bores and threaded bases, may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

Figure 3:
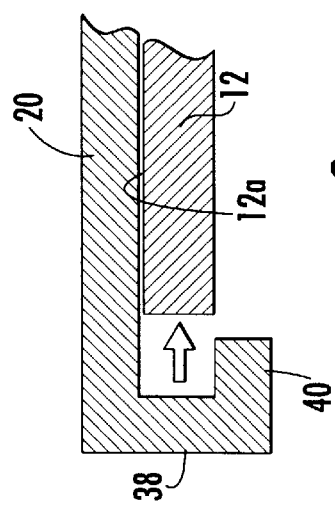
FIG. 3 is a cross-sectional view of the support plate of the present invention engaging a semiconductor device in accordance with the present invention.
Figure 4:
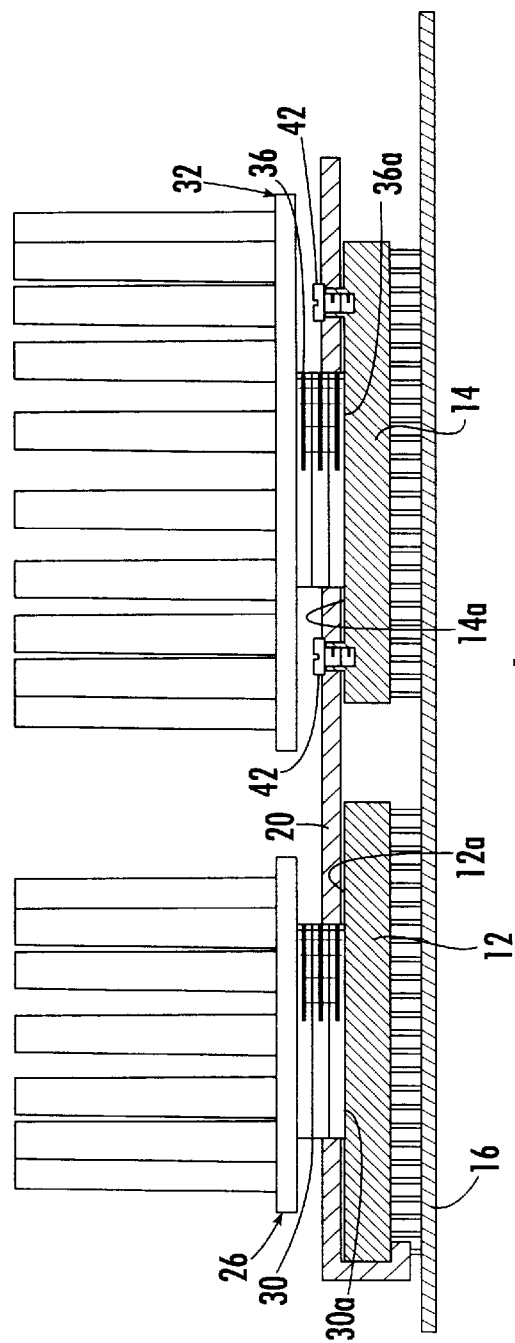
FIG. 4 is a cross-sectional view through the line 4—4 of FIG. 1.

Turning now to FIGS. 3 and 4, the installation of the heat sink assembly 10 of the present invention on the semiconductor devices 12, 14 is shown. The support plate 20 must first be secured relative to the first semiconductor device 12 and second semiconductor device 14 to be cooled. As seen in FIGS. 2 and 3, the support plate 20 preferably includes a downwardly depending leg 38 with an inwardly turned lip 40. As shown in FIG. 3, the lip 40 is engaged underneath the leftmost marginal portion of the first semiconductor device 12. The rightmost portion of the support plate 20 is secured to the second semiconductor device 14 by the engagement of threaded fasteners 42 routed through the support plate 20 into threaded engagement with the female threaded posts 18 extending upwardly from the upper surface 14a of the second semiconductor device 14.

Once the support plate 20 is secured in place, the heat dissipating members 26, 36 may be installed. The first heat dissipating member 26 is threaded into the first threaded bore 22 so that the flat bottom surface 30a of the base 30 of the first heat dissipating member 26 is placed into flush thermal communication with the top surface 12a of the first semiconductor device 12. Similarly, the second heat dissipating member 32 is threadably installed into the second threaded bore 24 so that the flat bottom surface 36a of the base 36 of the second heat dissipating member 32 is in flush thermal communication with the upper surface 14a of the second semiconductor device 14. The heat dissipating members 26, 36 are threadably adjustable so that the desired tension and pressure is exerted on the upper surfaces 12a, 14a of the semiconductor devices 12, 14 to ensure efficient heat dissipation. As the heat dissipating members 26, 36 are threadably tightened, the support plate 20 is lifted slightly and pressure on the bottom marginal portion of the first semiconductor device 12 is provided to maintain the first heat dissipating member 26 in flush communication with the upper surface 12a of the first semiconductor device 12.

Also, the employment of the leg 38 and lip 40 arrangement is optional but is preferably used to ensure that that portion of the support plate 20 over the first semiconductor device 12 is maintained in thermal contact with the upper surface 12a thereof. Many other structures may be employed in place of the leg 38 and lip 40 arrangement. For example, the downwardly depending leg 38 may include a small windows or apertures (not shown) to engage with protrusions (not shown) emanating outwardly from the sides of a socket (not shown) which is commonly found in ZIF socket configurations. Alternatively, the downwardly depending leg 38 may be simply bolted directly to the circuit board (not shown). The particular connection methods discussed above and other configurations employed depend on the particular application and installation environment at hand.

It is preferred that the support plate 20 be manufactured of plastic material, such as a high temperature resistant and high creep resistant plastic for better withstanding the high temperatures associated with semiconductors, particularly microprocessors. For example, the plastic material for the support plate may be LNP VERTON UF-700-10-HS (P.P.A. 50% long fiber) for use in high temperate heat sink applications. Alternatively, the support plate 20 may be manufactured of metal, such as aluminum, depending on the application. In addition, heat dissipating members 26, 32 are preferably metal, such as aluminum, for optimum thermal transfer and dissipation of heat from the semiconductor devices 12, 14. Alternatively, other thermally conductive materials, such as thermally conductive polymer compositions, may be employed for either or both the support plate 20 and the heat dissipating members 12, 14. A pin grid configuration with pins 28, 34 is shown but various other heat sink fin configurations, such as a radial fin array, may be employed.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

In view of the foregoing, the heat sink assembly 10 of the present invention can provide heat dissipation for multiple devices in a single assembly. Unlike prior art devices, the heat sink assembly 10 of the present invention, can provide different levels of heat dissipating to respective different devices within the array to be cooled. For example, in the figures above, the first semiconductor device 12 is smaller that the second semiconductor device package 14. Therefore, it is appropriate and efficient to employ a smaller heat dissipating member 26 for the first semiconductor device 12. Thus, the heat dissipating levels may be different and customized within the same device in accordance with the requirements of the individual devices to be cooled. In that connection, the support plate 20 may also be thermally conductive to distribute the thermal transfer across all heat dissipating members 26, 32 installed. In this application, both of the heat dissipating members 26, 32 are thermally linked and can share or redistribute the thermal load during use of the devices and, thereby, optimize thermal efficiency of the entire assembly.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from multiple semiconductor device packages, comprising:

a circuit board;

a first semiconductor device package installed on said circuit board; said first semiconductor package having a lower surface with electrical contacts thereon; said electrical contacts being in electrical communication with said circuit board; said first semiconductor package including an outer peripheral region and an upper surface;

a second semiconductor device package installed on said circuit board; said second semiconductor package having a lower surface with electrical contacts thereon; said electrical contacts being in electrical communication with said circuit board; said second semiconductor package including an outer peripheral region and an upper surface;

a support plate; said support plate being positioned over said upper surface of said first semiconductor device and over said upper surface of said second semiconductor device; said support plate defining a first threaded bore, having a diameter, substantially aligned with said first semiconductor device and said support plate defining a second threaded bore substantially, having a diameter, aligned with said second semiconductor device;

means for securing said support plate to relative to said first semiconductor device and said second semiconductor device; said means for securing said support plate to relative to said first semiconductor device and said second semiconductor device being a downwardly depending leg with a inwardly directed lip into communication with said outer peripheral portion of said first semiconductor device and at least one threaded fastener secured through said support plate and into communication with respective at least one female threaded apertures in said upper surface of said second semiconductor device package;

a first heat dissipating member having a threaded base portion, having a diameter, with a substantially flat bottom surface adapted to be threadably received in said first threaded bore so that said flat bottom surface of said first heat dissipating member is in flush thermal communication with the upper surface of said first semiconductor package; and a second heat dissipating member having a threaded base portion, having a diameter, with a substantially flat bottom surface adapted to be threadably received in said second threaded bore so that said flat bottom surface of said second heat dissipating member is in flush thermal communication with the upper surface of said second semiconductor package.

2. The heat sink assembly of claim 1, wherein said first heat dissipating member and said second heat dissipating member each include a plurality of heat dissipating elements.

3. The heat sink assembly of claim 1, wherein said support plate is made of thermally conductive polymer.

4. The heat sink assembly of claim 1, wherein said support plate is made of metal.

5. The heat sink assembly of claim 1, wherein the diameter of said first threaded bore is larger than the diameter of said second bore and said diameter of the threaded base portion of said first heat dissipating member is larger than the threaded base portion of the second heat dissipating member.

6. The heat sink assembly of claim 1, wherein said flat bottom surface of said first heat dissipating member is dimensioned to be substantially similar to said upper surface of said first semiconductor package and wherein said flat bottom surface of said second heat dissipating member is dimensioned to be substantially similar to said upper surface of said second semiconductor package.

* * * * *